United States Patent
Kashihara

(10) Patent No.: US 7,095,144 B2
(45) Date of Patent: Aug. 22, 2006

(54) RECTIFYING APPARATUS OF AC GENERATOR FOR VEHICLE

(75) Inventor: Toshiaki Kashihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/492,596

(22) PCT Filed: Oct. 28, 2002

(86) PCT No.: PCT/JP02/11127

§ 371 (c)(1),
(2), (4) Date: Apr. 15, 2004

(87) PCT Pub. No.: WO2004/038895

PCT Pub. Date: May 6, 2004

(65) Prior Publication Data

US 2005/0146236 A1 Jul. 7, 2005

(51) Int. Cl.
*H02K 11/00* (2006.01)
*H02K 11/04* (2006.01)
*H02K 19/36* (2006.01)

(52) U.S. Cl. .................. 310/68 D; 310/71; 316/145

(58) Field of Classification Search .............. 310/68 D, 310/68 R, 91
See application file for complete search history.

(56) References Cited

U.S. PATENT DOCUMENTS 4,305,121 A * 12/1981 Lack et al. ................. 363/141
5,453,648 A * 9/1995 Bradfield ..................... 310/71
5,659,212 A * 8/1997 DePetris .................. 310/68 D
5,883,450 A * 3/1999 Abadia et al. ............ 310/68 D
6,150,196 A * 11/2000 Tanaka et al. ............. 438/122
6,150,741 A * 11/2000 Hayashi et al. .......... 310/68 D
2002/0047360 A1* 4/2002 Kaizu ...................... 310/68 D
2002/0113510 A1* 8/2002 Morikaku et al. ........... 310/91
2003/0102735 A1* 6/2003 Asao ....................... 310/68 D

FOREIGN PATENT DOCUMENTS

| JP | 56-78131 A | 6/1981 |
|---|---|---|
| JP | 1-129740 A | 5/1989 |
| JP | 2000-240633 A | 9/2000 |
| JP | 2002-238209 A | 8/2002 |

* cited by examiner

*Primary Examiner*—Darren Schuberg
*Assistant Examiner*—Erik Preston
(74) *Attorney, Agent, or Firm*—Sughrue Mion, PLLC

(57) ABSTRACT

This invention includes an AC generator having a stator and a rotor supported by a frame, positive-side and negative-side radiation boards arranged within the frame and supporting positive-side and negative-side rectifying devices, respectively, for rectifying an AC output of the AC generator, an output terminal member penetrating the positive-side and negative-side radiation boards to be exposed to outside of the frame and electrically and mechanically connected with the positive-side radiation board, and a connection part forming member made of a material having the same coefficient of linear expansion as that of the output terminal member, a material having higher thermal conductivity than the positive-side radiation board, or a material having a lower ionization tendency than the positive-side radiation board, at a connection part of the positive-side radiation board with the output terminal member.

24 Claims, 6 Drawing Sheets

A < B

RECTIFYING APPARATUS OF AC GENERATOR FOR VEHICLE

TECHNICAL FIELD

This invention relates to a rectifying apparatus of an AC generator for vehicle, constructed by integrally combining an AC generator provided in an automobile or the like and a rectifying apparatus for rectifying an output of the AC generator, and a method for manufacturing the same.

BACKGROUND ART

As a rectifying apparatus of an AC generator for vehicle of this type, there is, for example, a rectifying apparatus described in JP-A-11-220858. Such a rectifying apparatus of an AC generator for vehicle includes a positive-side radiation board with plural (for example, four) positive-side rectifying devices mounted thereon, a negative-side radiation board with plural (for example, four) negative-side rectifying devices mounted thereon, and a terminal board having a wiring member electrically connecting the rectifying devices with a stator winding. For heat sinks, which are radiation boards, an aluminum (hereinafter referred to as Al) material of lightweight and good radiation property is generally used. A metal plate such as an Al plate or copper plate having high thermal conductivity is formed (by die-casting, metal plate working or the like) into a predetermined shape. An output terminal bolt for taking out an output of the generator to outside is pressed into and thereby electrically connected to the positive-side radiation board, and the output terminal bolt is protruding out of an AC generator frame. The output terminal bolt also serves for fixing the rectifying apparatus to the frame. Together with another attachment bolt, it fixes the rectifying apparatus, for example, at two points. Since the AC generator frame functions as a grounding electrode, the positive-side radiation board with the output terminal bolt and the frame are attached in the state of being electrically insulated, while the negative-side radiation board and the frame are directly attached electrically and thermally. The positive-side radiation board and the negative-side radiation board are electrically insulated from each other at the parts where the output terminal bolt and the attachment bolt are inserted, and are superimposed in their axial direction. These radiation boards share the bolts for attachment to the frame. Since the positive-side radiation board with its temperature rising higher than the temperature of the negative-side radiation board is situated more closely to the center of the frame (inner side in the radial direction of the negative-side radiation board), it takes in a cooling stream more efficiently for cooling.

The output terminal bolt is roulette-processed so that its contact area in a fitting range increases, but the radiation boards have smooth surfaces and ordinary hole areas. Roulette-processing normally means formation of protruding and recessed parts on a fitting surface. When the bolt is pressed in, the top of the protruding part of the protruding and recessed parts cuts into the corresponding surface, and as a part of the top shifts to the recessed part and flattened as a whole, the pressed side and the pressing side are tightly integrated.

Generally, the positive-side radiation board is made of an Al material, and the output terminal bolt pressed into the positive-side radiation board and serving for electrical connection is made of a Fe material. Therefore, as a current (output current) flowing through the output terminal bolt that is pressed in is increased, contact thermal resistance of the press-in fitting part increases, and not only the positive-side radiation board but also the negative-side radiation board and an insulating mold on the AC generator frame melt. There is a risk of failure in secure electrical connection.

Moreover, since the Al material has a higher ionization tendency and the output terminal bolt is protruding from the AC generator frame, foreign matter such as water and cooling water easily enters the rectifying apparatus along the output terminal bolt. There is a problem of corrosion and damage of the periphery of the output terminal bolt fitting part.

Furthermore, in attachment to a vehicle, because of a force applied when a wiring is connected to the output terminal bolt, the press-in fitting part on the radiation board may be easily displaced.

DISCLOSURE OF THE INVENTION

In view of the foregoing problems, it is an object of this invention to more securely carry out electrical and mechanical connection of the radiation board and the output terminal member in the rectifying apparatus of an AC generator for vehicle.

To achieve the foregoing object, this invention includes an AC generator having a stator and a rotor supported by a frame, positive-side and negative-side radiation boards arranged within the frame and supporting positive-side and negative-side rectifying devices, respectively, for rectifying an AC output of the AC generator, an output terminal member penetrating the positive-side and negative-side radiation boards to be exposed to outside of the frame and electrically and mechanically connected with the positive-side radiation board, and a connection part forming member made of a material having the same coefficient of linear expansion as that of the output terminal member, a material having higher thermal conductivity than the positive-side radiation board, or a material having a lower ionization tendency than the positive-side radiation board, at a connection part of the positive-side radiation board with the output terminal member.

Moreover, as a method for manufacturing a rectifying apparatus of an AC generator for vehicle as described above, this invention provides a manufacturing method including covering an outer periphery of a connection part forming member forming a connection part of a positive-side radiation board with an output terminal member, with a thin metal foil made of a material having a lower melting point or solidus temperature than the member, then using this as an insertion member to constitute the positive-side radiation board by double-mold casting, and melting only the metal foil at the time of the casting.

According to this invention, since the connection part forming member made of the material having the same coefficient of linear expansion as that of the output terminal member is provided at the connection part of the positive-side radiation board with the output terminal member, expansion of the contact surface in a heat cycle in the vehicle atmosphere can be prevented, that is, a good contact state of the contact part can be maintained irrespective of the vehicle atmosphere temperature. Contact thermal resistance can be reduced and unwanted heating of the output terminal member can be restrained.

Moreover, since the connection part forming member is made of a material having higher thermal conductivity than the positive-side radiation board, heat can be prevented from staying at the connection part of the positive-side radiation board with the output terminal member, and heating of the output terminal member can be smoothly transferred to the positive-side radiation board.

Furthermore, since the periphery of the output terminal member, which becomes a contaminant entry path for salt water or the like from outside of the AC generator, has a lower ionization tendency than the positive-side radiation board, rusting and corrosion can be effectively prevented and hence thermal resistance at this part can be reduced.

Moreover, with the method for manufacturing a rectifying apparatus of an AC generator for vehicle according to this invention, a sufficient contact area can be secured between the positive-side radiation board and the output terminal member and the degree of adhesion can be improved by the double mold.

BEST MODE FOR CARRYING OUT THE INVENTION

EMBODIMENT 1

Figure 1:
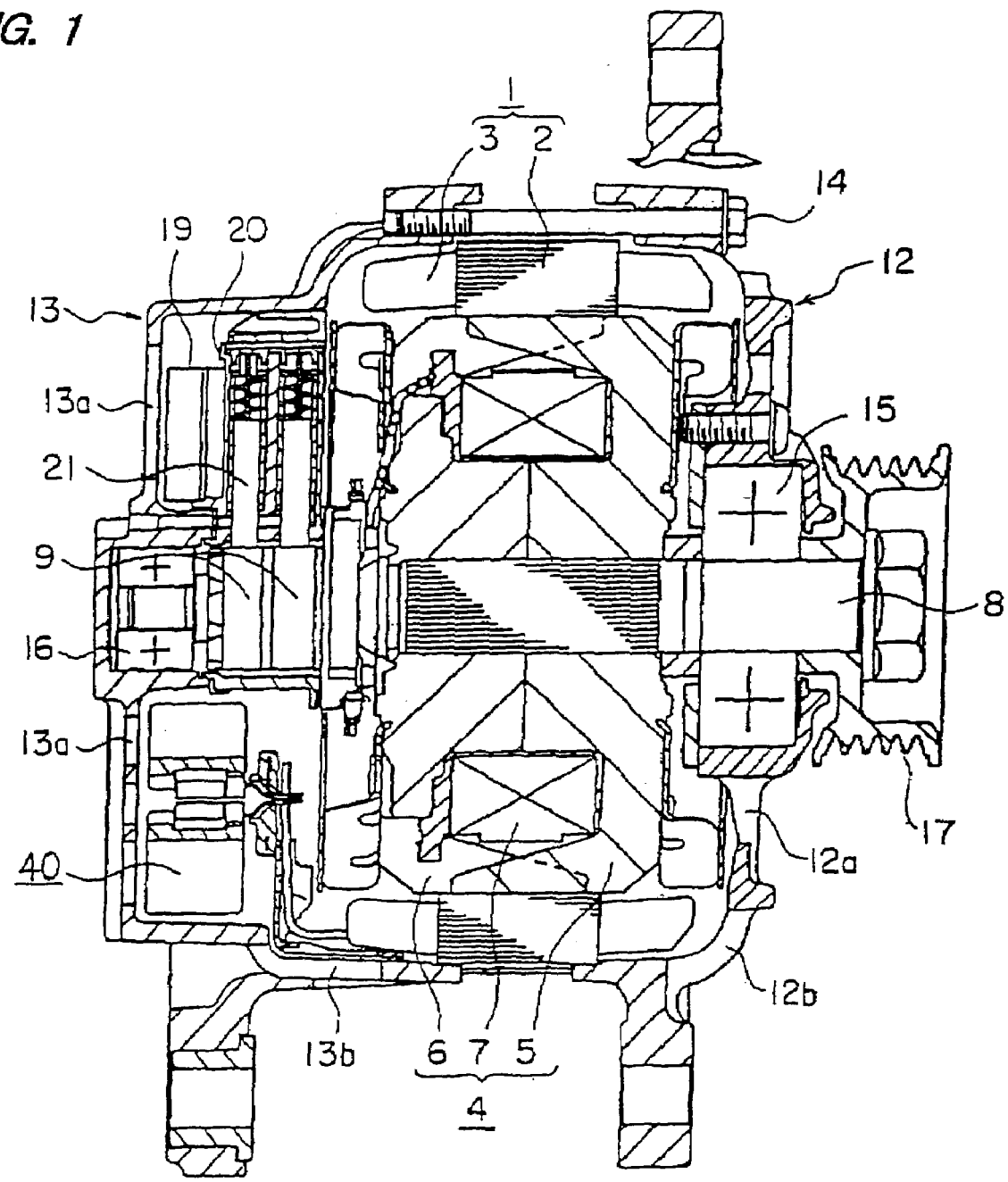
FIG. 1 is a sectional view of an AC generator for vehicle representing Embodiment 1.

FIG. 1 is a structural view showing an AC generator for vehicle. In FIG. 1, a stator 1 includes a stator core 2 and a stator coil 3 wound on this stator core 2. A rotor 4 includes a pair of pole cores 5, 6 facing each other, an excitation coil 7 inserted between the cores 5, 6, a rotary shaft 8, and a slip ring 9 fixed on the rotary shaft 8. A front frame 12 has an air intake hole 12a and an air outlet hole 12b, and a rear frame 13 has an air intake hole 13a and an air outlet hole 13b. The rear frame 13 is fixed on the front frame 12 by a fastening bolt 14, and the stator 1 is supported between the front frame 12 and the rear frame 13. The rotary shaft 8 is supported by the front frame 12 and the rear frame 13 via bearings 15, 16.

A pulley 17 is fixed at one end of the rotary shaft 8. A rectifying apparatus 40, which will be described later, is mounted on the rear frame 13 and connected with an output terminal of the stator coil 3, thus converting AC generated by the stator 1 to DC. A voltage regulator 19 is mounted on the rear frame 13 together with a brush holder 20. The brush holder 20 supports a brush 21 so that the brush 21 is abutted against the slip ring 9.

In the AC generator for vehicle constructed as described above, a current is supplied to the excitation coil 7 via the brush 21 and the slip ring 9. At the same time, rotational torque of an engine is transmitted to the rotary shaft 8 via the pulley 17 and a belt (not shown), and the rotor 4 is rotationally driven. This causes the stator 1 to generate AC. Then, this AC is converted to DC by the rectifying apparatus 40.

Figure 2:
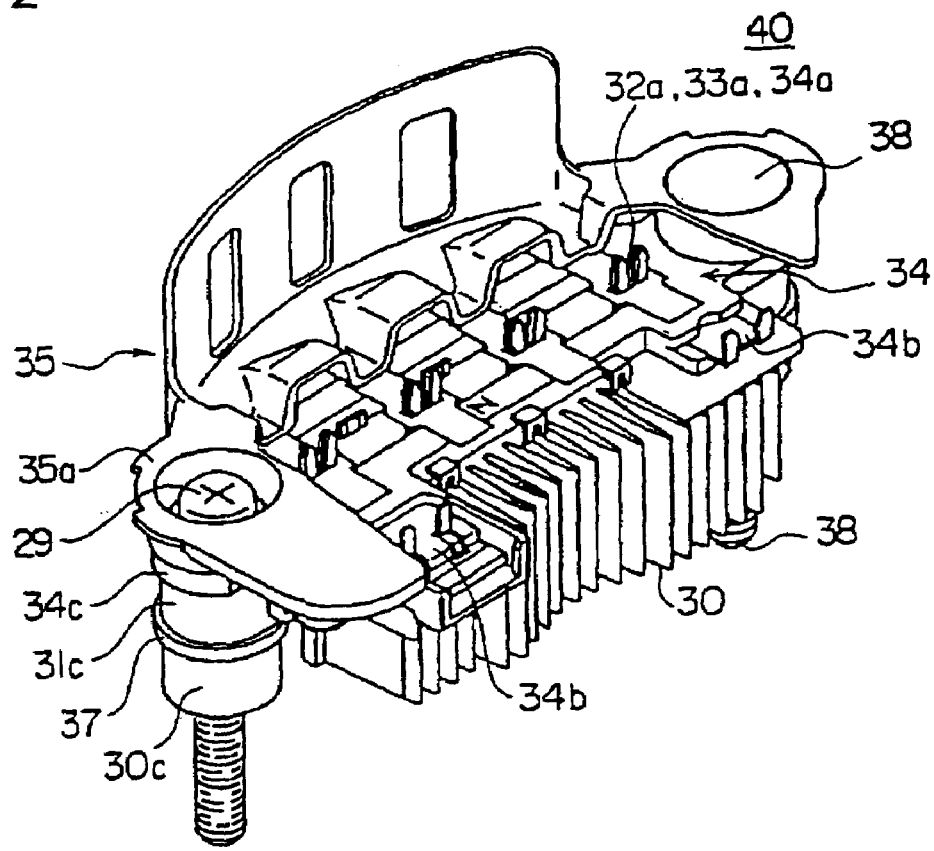
FIG. 2 is a perspective view showing a rectifying apparatus of the AC generator for vehicle according to Embodiment 1.
Figure 3:
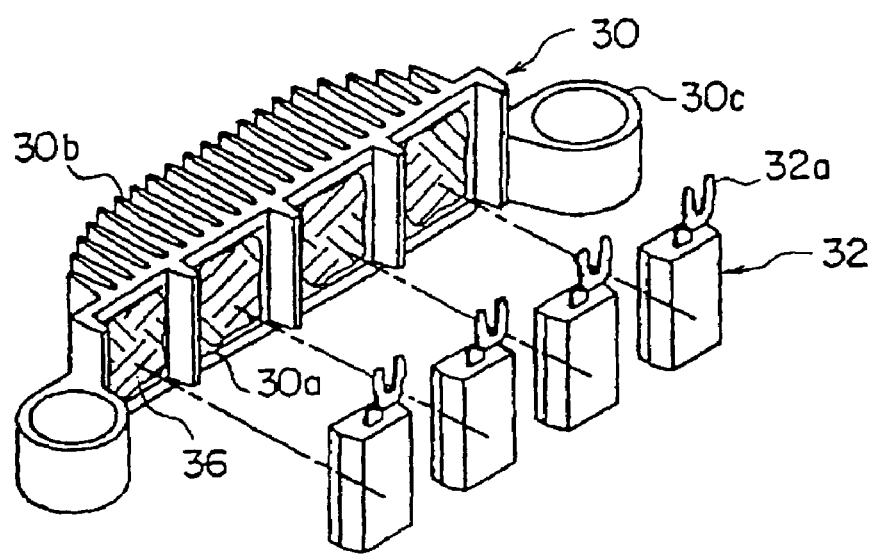
FIG. 3 is an exploded perspective view of a negative-side radiation board of the rectifying apparatus in Embodiment 1.
Figure 4:
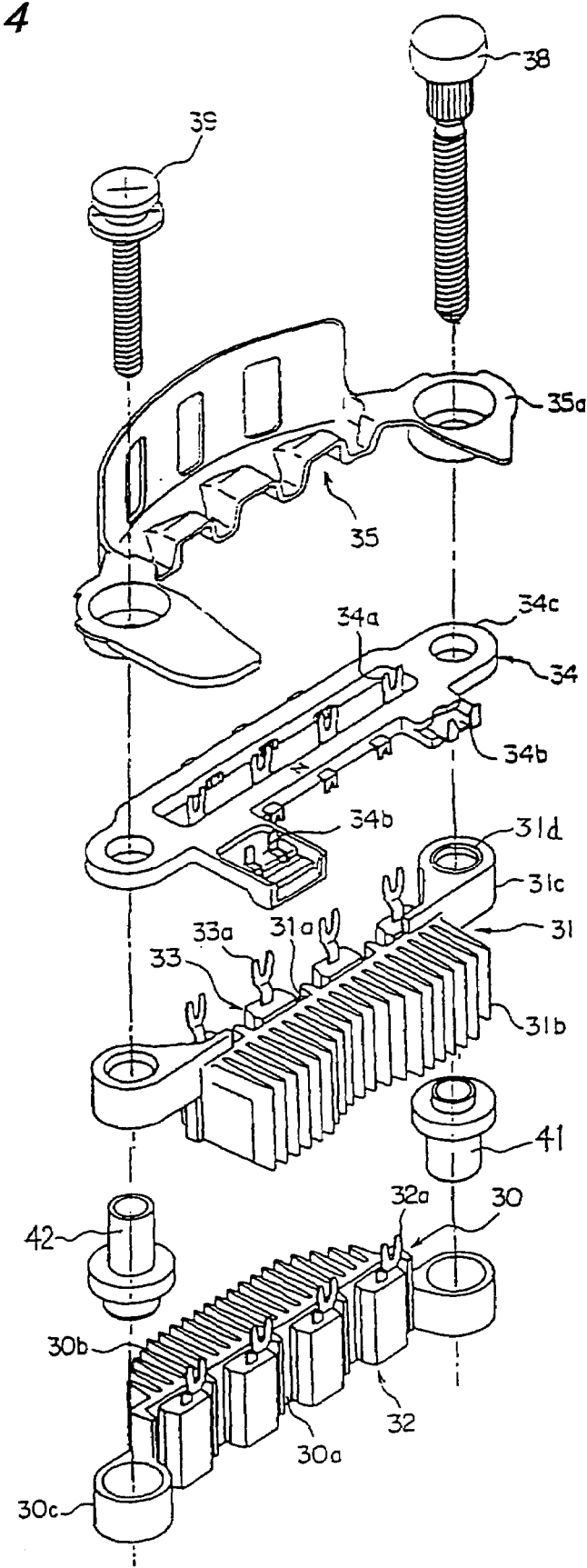
FIG. 4 is an exploded perspective view of the rectifying apparatus in Embodiment 1.

In FIGS. 2 to 4, a negative-side radiation board 30 is made of aluminum and has plural negative-side rectifying device mounting parts 30a, plural radiation fins 30b and a pair of ring-shaped guide parts 30c. A positive-side radiation board 31 is made of aluminum and has plural positive-side rectifying device mounting parts 31a, plural radiation fins 31b and a pair of ring-shaped guide parts 31c. A negative-side rectifying device 32 has an IC chip molded with a resin and has a protruding stator coil connection terminal 32a. A positive-side rectifying device 33 has an IC chip molded with a resin and has a protruding stator coil connection terminal 33a. A terminal stand 34 is molded with a polyphenylene sulfide (PPS) resin and has plural protruding stator connection terminals 34a, a pair of voltage regulator connection terminals 34b and a pair of ring-shaped guide parts 34c. A guide 35 is made of a PPS resin and has a pair of ring-shaped guide parts 35a.

Next, a method for assembling the rectifying apparatus 40 will be described. First, as shown in FIG. 3, the negative-side rectifying device 32 is joined by a solder 36 to each of the rectifying device mounting parts 30a of the negative-side radiation board 30. Similarly, the positive-side rectifying device 33 is joined by a solder to each of the rectifying device mounting parts 31a of the positive-side radiation board 31.

Then, the negative-side radiation board 30, the positive-side radiation board 31, the terminal stand 34 and the guide 35 are superimposed on each other, guided by their respective guide parts. An output terminal member 38 is pressed into a hole of the guide parts to integrally connect the components, and an attachment bolt 39 is inserted in the hole. The rectifying apparatus 40 is thus assembled as shown in FIG. 2.

In this rectifying apparatus 40, insulating spacers 41, 42 are inserted between the guide parts 30c, 31c, thus securing insulation between the negative-side radiation board 30 and the positive-side radiation board 31. The stator connection terminals 32a, 33a, 34a of the negative-side radiation board 30, the positive-side radiation board 31 and the terminal stand 34 are superimposed, forming a connection part with the stator coil 3. Moreover, the rectifying apparatus 40 is fixed at a predetermined position on the rear frame 13 by the output terminal member 38 and the attachment bolt 39.

In this Embodiment 1, as a connection part forming member forming a connection part with the output terminal member 38, of the positive-side radiation board 31 constituting the rectifying apparatus 40, an insertion member 31d made of a different metal is provided concentrically with the guide part 31c of the positive-side radiation board 31.

Figure 5:
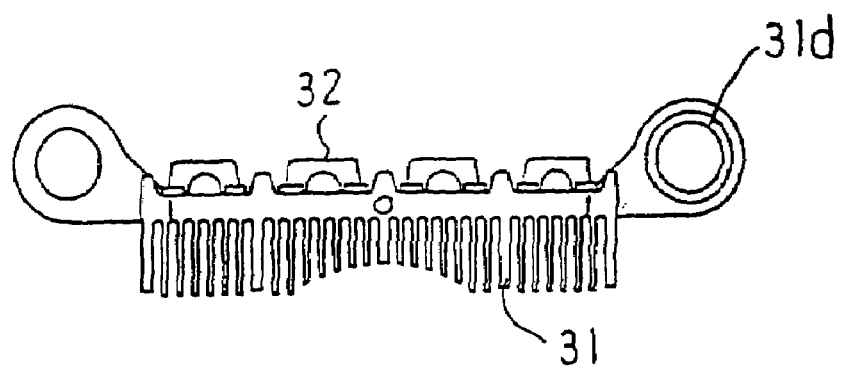
FIG. 5 is a plan view of a positive-side radiation board of the rectifying apparatus in Embodiment 1.
Figure 6:
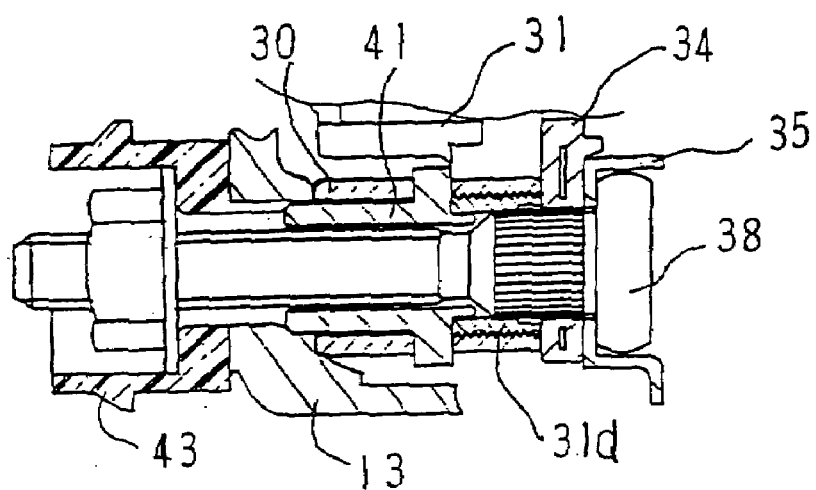
FIG. 6 is a sectional view of the periphery of an output terminal member of the rectifying apparatus in Embodiment 1.

That is, as shown in FIGS. 5 and 6, a connection part between the positive-side radiation board 31 and the insertion member 31*d* formed in a recessed and protruding shape to have an increased contact area is constructed by double-mold casting. At the connection part of the aluminum positive-side radiation board 31 with the output terminal member 38, an insertion member is provided, for example, using Fe insertion, Cu insertion, Cu—Zn insertion and the like. In these cases, an Fe bolt, Cu bolt and Cu—Zn bolt are used, respectively, as the output terminal member 38, and the bolt is pressed into a hollow part of the insertion member 31*d*. The distal end of the bolt is exposed to outside of the rear frame 13 and an outer conductor is connected thereto via an insulating member 43.

With such a structure, since the insertion member 31*d* embedded in the positive-side radiation board 31 and the output terminal member 38 are made of the same material and therefore have the same coefficient of linear expansion, expansion of the contact surface in a heat cycle in the vehicle atmosphere can be prevented, that is, both press-in contact surfaces can be kept constant irrespective o f the vehicle atmosphere temperature. Contact thermal resistance is reduced and heating of the output terminal member can be prevented.

Moreover, as Cu or Cu(60%)—Zn(40%) based alloy having high thermal conductivity is used for the insertion member 31*d*, contact thermal resistance can be reduced.

Figure 7:
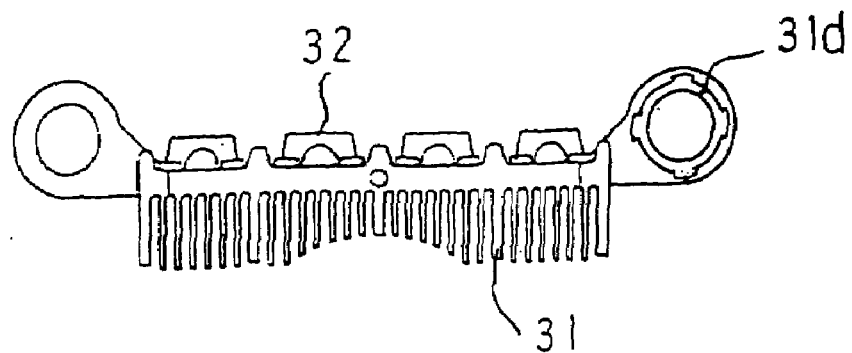
FIG. 7 is a plan view showing another example of the positive-side radiation board of the rectifying apparatus in Embodiment 1.
Figure 8:
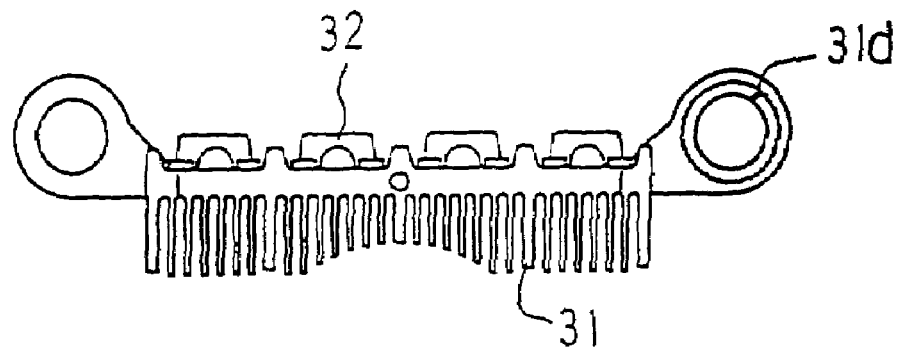
FIG. 8 is a plan view showing still another example of the positive-side radiation board of the rectifying apparatus in Embodiment 1.

Although the outer periphery of the insertion member 31*d* has a recessed and protruding cylindrical shape, other shapes may also be used. As long as a large contact area and integration of both parts are realized, the outer periphery of the insertion member 31*d* can be formed in such a manner that at least a part of its circumferential contact surface is bent in an angled or rectangular shape, as shown in FIG. 7. For example, a simple columnar shape with increased friction may be used (FIG. 8). On the contrary, instead of the cylindrical shape, a barrel shape with its central part expanding in the direction of axial length or a conical shape may be used. Since insertion casting is employed, the degree of freedom in shape is high.

Not only with the arrangement and shape of the output terminal member 38 and the structure of the rectifying apparatus 40, but also in the case where the output terminal member protrudes in the radial direction of the AC generator or in the case where the rectifying apparatus has an arcuate shape, similar effects can be realized.

EMBODIMENT 2

Figure 9:
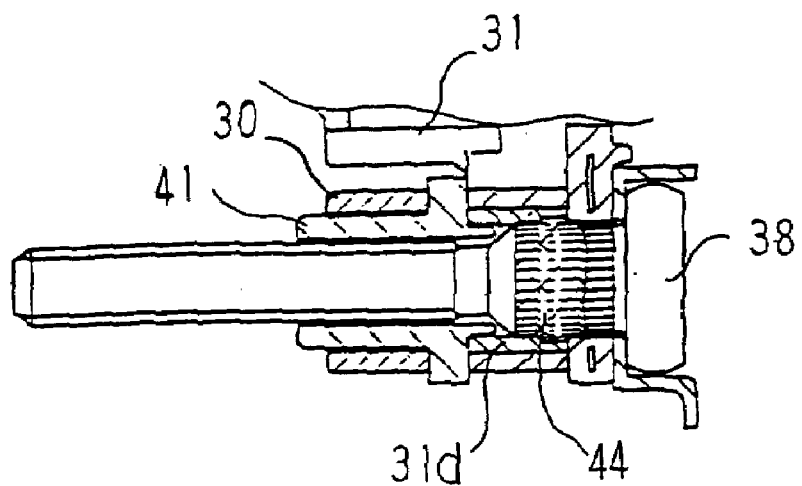
FIG. 9 is a sectional view of the periphery of an output terminal member of a rectifying apparatus according to Embodiment 2.

As shown in FIG. 9, the space between the insertion member 31*d* and the output terminal member 38 of Embodiment 1 is filled with a thermally conductive member 44. A method of applying the thermally conductive member 44 to the periphery of a press-in part of the output terminal member 38 before pressing in, or a method of applying the thermally conductive member 44 to the inner peripheral side of the insertion member 31*d* is used. By doing so, heat from the output terminal member 38 can be efficiently transmitted to the positive-side radiation board 31.

EMBODIMENT 3

As Cu or Cu(60%)—Zn(40%) based alloy having a low ionization tendency is used for the insertion member 31*d* of Embodiment 1, rusting and corrosion due to entry of salt water at the time of mounting the apparatus on a vehicle can be prevented, and damage to the insertion member itself can be prevented to maintain the contact surface. If SUS (Fe—Ni—Cr alloy steel), which is highly anti-corrosive, is used as an Fe-based material, similar effects can be realized.

EMBODIMENT 4

Figure 10:
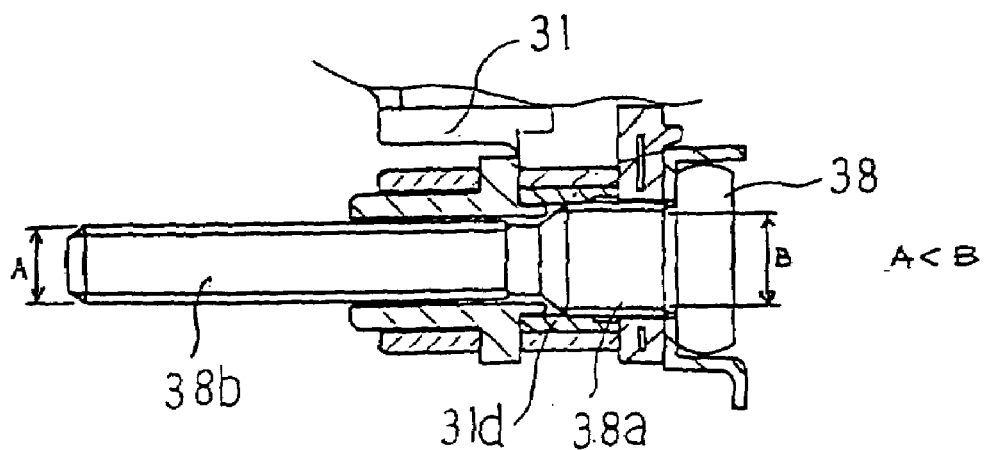
FIG. 10 is a sectional view of the periphery of an output terminal member of a rectifying apparatus according to Embodiment 4.

As shown in FIG. 10, the connection part between the output terminal member 38 and the positive-side radiation board 31 is formed by a male screw part 38*a* (for example, M12). The male screw part 38*a* has a larger root diameter B than an outer diameter A of an attachment male screw part 38*b* (for example, M8) of an output conductor connected with a storage battery (not shown) arranged on the periphery of the distal end of the output terminal, and is formed in such a manner that the screwing direction of the male screw part 38*a* is the reverse of the screwing direction of the male screw part 38*b*.

This enables screw fastening of the output conductor to the periphery of the distal end of the output terminal member 38 exposed to outside of the rear frame 13, after mounting the output terminal member 38 on the positive-side radiation board 31 and mounting the rectifying apparatus 40 on the rear frame 13. Moreover, since the screwing directions at two positions provided on the output terminal member 38 are different, the screw connection between the output terminal member 38 and the positive-side radiation board 31 will not be loose when fastening the outer output conductor.

EMBODIMENT 5

Figure 11:
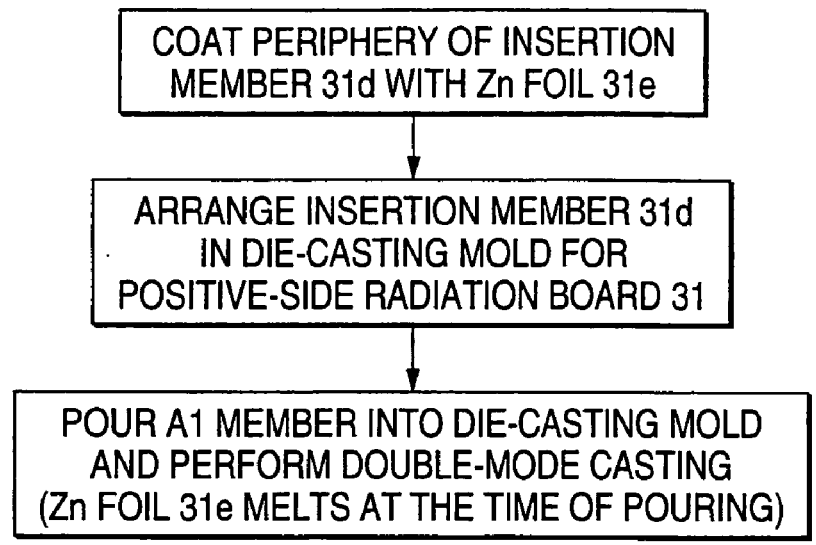
FIG. 11 is an explanatory view showing a process of manufacturing a rectifying apparatus according to Embodiment 5.

An example of a method for manufacturing the positive-side radiation board used in the rectifying apparatus 40 of this invention is shown in FIG. 11.

Figure 12:
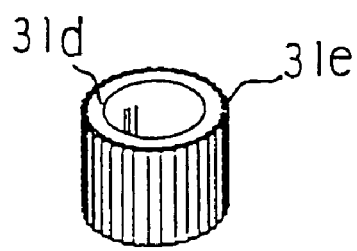
FIG. 12 is a perspective view of an insertion member used in the manufacturing method of Embodiment 5.

First, the insertion member 31*d* having its outer periphery coated in advance with a Zn foil 31*e* of 0.1 mm or less by electrogalvanizing or galvanizing is prepared (FIG. 12). Next, this insertion member 31*d* is arranged in a die-casting mold for the positive-side radiation board 31 and an Al material as the material of the positive-side radiation board 31 is poured in this state, thus performing double-mold casting.

As this Al material in the die-casting method, an ADC material, which is an Al—Si based alloy, is generally used and its solidus temperature is 580° C. Therefore, the melting temperature is 580° C. As the insertion member, for example, Fe, Cu or Cu(60%)—Zn(40%) based alloy is used. In this case, the melting point and solidus temperature of each metal is 1535° C. for Fe, 1083° C. for Cu and 905° C. for Cu(60%)—Zn(40%), which is higher than the above-described Al melting temperature of 580° C. Therefore, the insertion member 31*d* will not be melted or largely deformed at the time of Al casting.

Moreover, since the Zn melting point is 420° C. compared with the Al melting temperature of 580° C., only the surface of the Zn foil 31*e* on the insertion member 31*d* is melted at the time of Al casting and pouring. It completely covers the contact surface between the positive-side radiation board 31 and the insertion member 31*d* and fills a minute casting space generated in the aluminum die-casting method. Therefore, the degree of adhesion by double-mold casting can be improved.

INDUSTRIAL APPLICABILITY

This invention is used for a rectifying apparatus of an AC generator for vehicle, constructed by integrally combining an AC generator provided in an automobile or the like and a rectifying apparatus for rectifying an output of the AC generator.

The invention claimed is:

1. A rectifying apparatus of an AC generator for a vehicle, comprising:
    positive-side and negative-side radiation boards arranged within a frame of the AC generator and supporting positive-side and negative-side rectifying devices, respectively, for rectifying an AC output of the AC generator;
    an output terminal member penetrating the positive-side and negative-side radiation boards to be exposed to outside of the frame and electrically and mechanically connected with the positive-side radiation board; and
    a connection part forming member made of a material having the same coefficient of linear expansion as that of the output terminal member, at a connection part of the positive-side radiation board with the output terminal member,
    wherein the positive-side radiation board includes a plurality of radiation fins which are positioned over the positive-side rectifying devices, and the negative-side radiation board includes a plurality of radiation fins which are positioned over the negative-side rectifying devices.

2. The rectifying apparatus of an AC generator for a vehicle as claimed in claim 1, wherein the connection part forming member is formed by an insertion member and is made of a material selected from Fe, Cu, and Cu(60%)—Zn(40%) based alloy, corresponding to the material of the output terminal member.

3. The rectifying apparatus of an AC generator for a vehicle as claimed in claim 1, wherein at least a part of a circumferential contact surface of the connection part forming member is bent in an angled or rectangular shape.

4. The rectifying apparatus of an AC generator for a vehicle as claimed in claim 1, wherein the output terminal member has a first male screw part with which it is fastened to the positive-side radiation board and a second male screw part with which an outer output conductor is fastened, wherein the first male screw part has a larger root diameter than an outer diameter of the second male screw part, and the first male screw part has a screwing direction that is the reverse of a screwing direction of the second male screw part.

5. The rectifying apparatus of claim 1, wherein the radiation fins of the positive-side radiation board extend in a first direction, and the radiation fins of the negative-side radiation board extend in a second direction, the first direction being opposite the second direction.

6. A rectifying apparatus of an AC generator for a vehicle, comprising:
    positive-side and negative-side radiation boards arranged within a frame of the AC generator and supporting positive-side and negative-side rectifying devices, respectively, for rectifying an AC output of the AC generator;
    an output terminal member penetrating the positive-side and negative-side radiation boards to be exposed to outside of the frame and electrically and mechanically connected with the positive-side radiation board; and
    a connection part forming member made of a material having higher thermal conductivity than the positive-side radiation board, at a connection part of the positive-side radiation board with the output terminal member,
    wherein the positive-side radiation board includes a plurality of radiation fins which are positioned over the positive-side rectifying devices, and the negative-side radiation board includes a plurality of radiation fins which are positioned over the negative-side rectifying devices.

7. The rectifying apparatus of an AC generator for a vehicle as claimed in claim 6, wherein the connection part forming member is formed by an insertion member and is made of a material selected from Cu and Cu(60%)—Zn(40%) based alloy, corresponding to the material of the output terminal member.

8. The rectifying apparatus of an AC generator for a vehicle as claimed in claim 6, wherein a space between the connection part forming member and the output terminal member is filled with a thermally conductive member.

9. The rectifying apparatus of claim 6, wherein the radiation fins of the positive-side radiation board extend in a first direction, and the radiation fins of the negative-side radiation board extend in a second direction, the first direction being opposite the second direction.

10. A rectifying apparatus of an AC generator for a vehicle, comprising:
    positive-side and negative-side radiation boards arranged within a frame of the AC generator and supporting positive-side and negative-side rectifying devices, respectively, for rectifying an AC output of the AC generator; and
    an output terminal member penetrating the positive-side and negative-side radiation boards to be exposed to outside of the frame and electrically and mechanically connected with the positive-side radiation board,
    wherein a connection part forming member made of a material having a lower ionization tendency than the positive-side radiation board is provided at a connection part of the positive-side radiation board with the output terminal member, and
    wherein the positive-side radiation board includes a plurality of radiation fins which are positioned over the positive-side rectifying devices, and the negative-side radiation board includes a plurality of radiation fins which are positioned over the negative-side rectifying devices.

11. The rectifying apparatus of an AC generator for a vehicle as claimed in claim 10, wherein the connection part forming member is formed by an insertion member and is made of a material selected from Fe, Cu, Cu (60%)—Zn (40%) based alloy, and SUS (Fe—Ni—Cr alloy steel).

12. The rectifying apparatus of claim 10, wherein the radiation fins of the positive-side radiation board extend in a first direction, and the radiation fins of the negative-side radiation board extend in a second direction, the first direction being opposite the second direction.

13. A rectifying apparatus of an AC generator for a vehicle, comprising:
    positive-side and negative-side radiation boards arranged within a frame of the AC generator and supporting positive-side and negative-side rectifying devices, respectively, for rectifying an AC output of the AC generator;
    an output terminal member penetrating the positive-side and negative-side radiation boards to be exposed to outside of the frame and electrically and mechanically connected with the positive-side radiation board; and
    a connection part forming member made of a material having higher thermal conductivity than the positive-side radiation board, at a connection part of the positive-side radiation board with the output terminal member, wherein the positive-side radiation board includes a plurality of radiation fins which extend in a first direction, and the negative-side radiation board includes a plurality of radiation fins which extend in a second direction, the first direction being opposite the second direction.

14. The rectifying apparatus of an AC generator for a vehicle as claimed in claim 13, wherein the connection part forming member is formed by an insertion member and is made of a material selected from Cu and Cu(60%)—Zn (40%) based alloy, corresponding to the material of the output terminal member.

15. The rectifying apparatus of an AC generator for a vehicle as claimed in claim 13, wherein a space between the connection part forming member and the output terminal member is filled with a thermally conductive member.

16. The rectifying apparatus of claim 13, wherein the radiation fins of the positive-side radiation board are positioned over the positive-side rectifying devices, and the radiation fins of the negative-side radiation board are positioned over the negative-side rectifying devices.

17. A rectifying apparatus of an AC generator for a vehicle, comprising:
   positive-side and negative-side radiation boards arranged within a frame of the AC generator and supporting positive-side and negative-side rectifying devices, respectively, for rectifying an AC output of the AC generator;
   an output terminal member penetrating the positive-side and negative-side radiation boards to be exposed to outside of the frame and electrically and mechanically connected with the positive-side radiation board; and
   a connection part forming member made of a material having the same coefficient of linear expansion as that of the output terminal member, at a connection part of the positive-side radiation board with the output terminal member,
   wherein the positive-side radiation board includes a plurality of radiation fins which extend in a first direction, and the negative-side radiation board includes a plurality of radiation fins which extend in a second direction, the first direction being opposite the second direction.

18. The rectifying apparatus of an AC generator for a vehicle as claimed in claim 17, wherein the connection part forming member is formed by an insertion member and is made of a material selected from Fe, Cu, and Cu(60%)—Zn(40%) based alloy, corresponding to the material of the output terminal member.

19. The rectifying apparatus of an AC generator for a vehicle as claimed in claim 17, wherein at least a part of a circumferential contact surface of the connection part forming member is bent in an angled or rectangular shape.

20. The rectifying apparatus of an AC generator for a vehicle as claimed in claim 17, wherein the output terminal member has a first male screw part with which it is fastened to the positive-side radiation board and a second male screw part with which an outer output conductor is fastened, wherein the first male screw part has a larger root diameter than an outer diameter of the second male screw part, and the first male screw part has a screwing direction that is the reverse of a screwing direction of the second male screw part.

21. The rectifying apparatus of claim 17, wherein the radiation fins of the positive-side radiation board are positioned over the positive-side rectifying devices, and the radiation fins of the negative-side radiation board are positioned over the negative-side rectifying devices.

22. A rectifying apparatus of an AC generator for a vehicle comprising:
   positive-side and negative-side radiation boards arranged within a frame of the AC generator and supporting positive-side and negative-side rectifying devices, respectively, for rectifying an AC output of the AC generator; and
   an output terminal member penetrating the positive-side and negative-side radiation boards to be exposed to outside of the frame and electrically and mechanically connected with the positive-side radiation board,
   wherein a connection part forming member made of a material having a lower ionization tendency than the positive-side radiation board is provided at a connection part of the positive-side radiation board with the output terminal member, and
   wherein the positive-side radiation board includes a plurality of radiation fins which extend in a first direction, and the negative-side radiation board includes a plurality of radiation fins which extend in a second direction, the first direction being opposite the second direction.

23. The rectifying apparatus of an AC generator for a vehicle as claimed in claim 22, wherein the connection part forming member is formed by an insertion member and is made of a material selected from Fe, Cu, Cu(60%)—Zn (40%) based alloy, and SUS (Fe—Ni—Cr alloy steel).

24. The rectifying apparatus of claim 22, wherein the radiation fins of the positive-side radiation board are positioned over the positive-side rectifying devices, and the radiation fins of the negative-side radiation board are positioned over the negative-side rectifying devices.

* * * * *